(12) United States Patent
Xu et al.

(10) Patent No.: US 11,641,759 B2
(45) Date of Patent: May 2, 2023

(54) MANUFACTURING METHOD OF DISPLAY PANEL, DISPLAY PANEL AND DISPLAY DEVICE

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventors: Zi Xu, Shanghai (CN); Xinzhao Liu, Shanghai (CN); Lin Cheng, Shanghai (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 48 days.

(21) Appl. No.: 17/233,537

(22) Filed: Apr. 18, 2021

(65) Prior Publication Data
US 2021/0242425 A1 Aug. 5, 2021

(30) Foreign Application Priority Data
Dec. 23, 2020 (CN) .......................... 202011540061.9

(51) Int. Cl.
*H01L 51/56* (2006.01)
*H10K 50/844* (2023.01)
(Continued)

(52) U.S. Cl.
CPC ........... *H10K 50/844* (2023.02); *H10K 59/12* (2023.02); *H10K 71/00* (2023.02); *H10K 59/1201* (2023.02)

(58) Field of Classification Search
CPC ....................................................... H01L 51/56
See application file for complete search history.

(56) References Cited

U.S. PATENT DOCUMENTS

2007/0071885 A1\* 3/2007 Kumagai ................ H01L 51/56
313/506
2012/0049178 A1\* 3/2012 Sugimoto ........... H01L 27/3258
438/46

(Continued)

FOREIGN PATENT DOCUMENTS

CN 110400810 A 11/2019

*Primary Examiner* — Caleb E Henry
(74) *Attorney, Agent, or Firm* — Kilpatrick Townsend & Stockton LLP

(57) ABSTRACT

Disclosed are a manufacturing method of a display panel, a display panel and a display device. The manufacturing method includes the following steps: providing a base substrate; forming a planarization layer on a side of the base substrate; forming a first film layer on a side of the planarization layer facing away from the base substrate; forming an anode via penetrating through the first film layer and the planarization layer; forming an anode layer on a side of the first film layer facing away from the base substrate; patterning the anode layer to form a first opening on the anode layer; and after patterning the anode layer, patterning the first film layer to form a second opening on the first film layer. A material of the first film layer includes a non-metallic material.

18 Claims, 16 Drawing Sheets

(51) Int. Cl.
*H10K 59/12* (2023.01)
*H10K 71/00* (2023.01)

(56) References Cited

U.S. PATENT DOCUMENTS

| | | | |
|---|---|---|---|
| 2013/0069853 A1* | 3/2013 | Choi | H01L 27/3276 345/80 |
| 2014/0306229 A1* | 10/2014 | Ono | H01L 27/3258 438/34 |
| 2015/0090993 A1* | 4/2015 | Tokuda | H01L 27/3246 438/23 |
| 2016/0351846 A1* | 12/2016 | Kim | H01L 51/56 |
| 2017/0062755 A1* | 3/2017 | Im | H01L 51/5228 |
| 2017/0092178 A1* | 3/2017 | Lee | G09G 3/3275 |
| 2017/0345882 A1* | 11/2017 | Nam | H01L 27/3258 |
| 2018/0151645 A1* | 5/2018 | Lee | H01L 51/56 |
| 2018/0175127 A1* | 6/2018 | Lee | H01L 27/3265 |
| 2019/0198816 A1* | 6/2019 | Park | G02B 27/0176 |
| 2019/0206960 A1* | 7/2019 | Lee | H01L 27/3253 |
| 2020/0136068 A1* | 4/2020 | Lee | H01L 51/5284 |
| 2020/0251678 A1* | 8/2020 | Song | H01L 51/5271 |
| 2021/0151711 A1* | 5/2021 | Xu | H01L 27/3246 |

\* cited by examiner

MANUFACTURING METHOD OF DISPLAY PANEL, DISPLAY PANEL AND DISPLAY DEVICE

CROSS-REFERENCE TO RELATED APPLICATION

This application claims priority to Chinese Patent Application No. 202011540061.9 filed Dec. 23, 2020, the disclosure of which is incorporated herein by reference in its entirety.

FIELD

The present disclosure relates to the field of display and, in particular, to a manufacturing method of a display panel, a display panel and a display device.

BACKGROUND

With the development of display technologies, liquid crystal display panel and organic light-emitting display panel have gradually become two mainstream display panels. An organic light-emitting display panel includes arrays of light-emitting units, and each light-emitting unit includes an anode, a cathode and a light-emitting layer disposed between the anode and the cathode.

When the organic light-emitting display panel is manufactured, a complete anode layer is generally formed and then is etched to form mutually independent blocky electrodes. However, for the anode layer containing metal (such as silver), metal ions (silver ions) will be generated during the etching process.

SUMMARY

The disclosure provides a manufacturing method of a display panel, a display panel and a display device.

Embodiments of the present disclosure provide a manufacturing method of a display panel. The manufacturing method includes the steps described below.

A base substrate is provided.

A planarization layer is formed on a side of the base substrate.

A first film layer is formed on a side of the planarization layer facing away from the base substrate.

An anode via penetrating through the first film layer and the planarization layer is formed.

An anode layer is formed on a side of the first film layer facing away from the base substrate.

The anode layer is patterned to form a first opening on the anode layer.

After the anode layer is patterned, the first film layer is patterned to form a second opening on the first film layer;

A material of the first film layer includes a non-metallic material; the first opening penetrates through the anode layer, and the second opening at least partially penetrates through the first film layer; and an orthographic projection of the second opening on the base substrate at least partially overlaps an orthographic projection of the first opening on the base substrate.

Embodiments of the present disclosure further provide a display panel. The display panel includes a base substrate and a planarization layer and a first film layer and an anode layer.

The planarization layer is disposed on a side of the base substrate.

The first film layer is disposed on a side of the planarization layer facing away from the base substrate, and the anode layer is disposed on a side of the first film layer facing away from the base substrate; and an anode via is provided in the first film layer and the planarization layer, and the anode layer is filled in the anode via.

The anode layer is provided with a first opening, and the first opening penetrates through the anode layer; and the first film layer is provided with a second opening, and the second opening at least partially penetrates through the first film layer.

A material of the first film layer is a non-metallic material; and an orthographic projection of the second opening on the base substrate at least partially overlaps an orthographic projection of the first opening on the base substrate.

Embodiments of the present disclosure further provide a display device. The display device includes the display panel described in other embodiments.

According to the manufacturing method of a display panel provided by the embodiments of the present disclosure, the first film layer is formed before the anode layer is formed, so that metal ions remaining after the first opening is formed by etching the anode layer fall on the first film layer exposed by the first opening; then, the first film layer exposed by the first opening is at least partially removed, so that at least part of the metal ions remaining on the first film layer is removed, thus the problem of metal ions remaining is alleviated, and the effect of reducing the risk of metal ions remaining and improving the production yield of the display panel is achieved.

DETAILED DESCRIPTION

Figure 1:
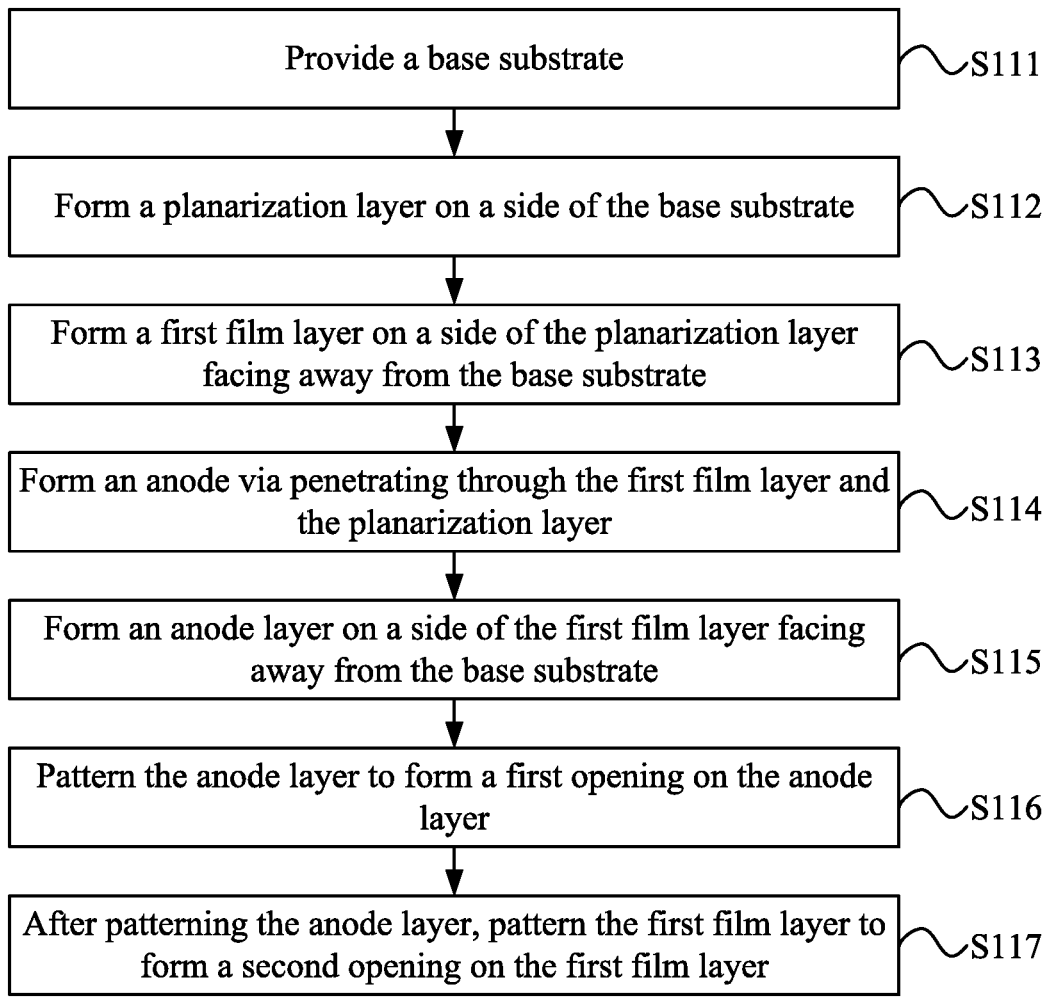
FIG. 1 is a flowchart of a manufacturing method of a display panel according to an embodiment of the present disclosure.

The present disclosure is further described below in detail in conjunction with drawings and embodiments. It is to be understood that the embodiments described herein are merely intended to explain the present disclosure and are not to limit the present disclosure. Additionally, it should be noted that for easy of description, only the part related to the present disclosure, instead of all, is illustrated in the drawings.

The embodiments of the present disclosure further provide a manufacturing method of a display panel. The manufacturing method includes the following steps: providing a base substrate; forming a planarization layer on a side of the base substrate; forming a first film layer on a side of the planarization layer facing away from the base substrate; forming an anode via penetrating through the first film layer and the planarization layer; forming an anode layer on a side of the first film layer facing away from the base substrate; patterning the anode layer to form a first opening on the anode layer; and after patterning the anode layer, patterning the first film layer to form a second opening on the first film layer. A material of the first film layer includes a non-metallic material; the first opening penetrates through the anode layer, and the second opening at least partially penetrates through the first film layer; and an orthographic projection of the second opening on the base substrate at least partially overlaps an orthographic projection of the first opening on the base substrate.

The first film layer is formed before the anode layer is formed, so that metal ions remaining after the first opening is formed by etching the anode layer fall on the first film layer exposed by the first opening; then, the first film layer exposed by the first opening is at least partially removed, so that at least part of the metal ions remaining on the first film layer is removed, and the effect of reducing the risk of metal ions remaining and improving the production yield of the display panel is achieved.

Hereinafter, schemes in the embodiments of the present disclosure will be described clearly and completely in conjunction with drawings in the embodiments of the present disclosure. Apparently, the embodiments described below are part, not all, of the embodiments of the present disclosure.

FIG. 1 is a flowchart of a manufacturing method of a display panel according to an embodiment of the present disclosure. Referring to FIG. 1, the manufacturing method of a display panel includes the steps described below.

In step S111, a base substrate is provided.

In one embodiment, the base substrate is configured to support and protect the film layers thereon. The base substrate may be a rigid substrate, for example, the material of the base substrate may be glass. The base substrate may also be a flexible substrate, for example, the material of the base substrate may include one or a combination of polymer resins of polyethersulfone, polyacrylate, polyetherimide, polyethylene naphthalate, polyethylene terephthalate, polyphenylene sulfide, polyarylate, polyimide, polycarbonate and cellulose acetate propionate. The material of the base substrate is not limited herein.

In step S112, a planarization layer is formed on a side of the base substrate.

In one embodiment, the planarization layer provides a function of planarizing. The material of the planarization layer may include organic materials such as polyimide, polyethylene terephthalate, polycarbonate, polyethylene, or polyacrylate. The thickness, material and film forming process of the planarization layer may all be set according to practical situations and are not limited herein.

Figure 2:
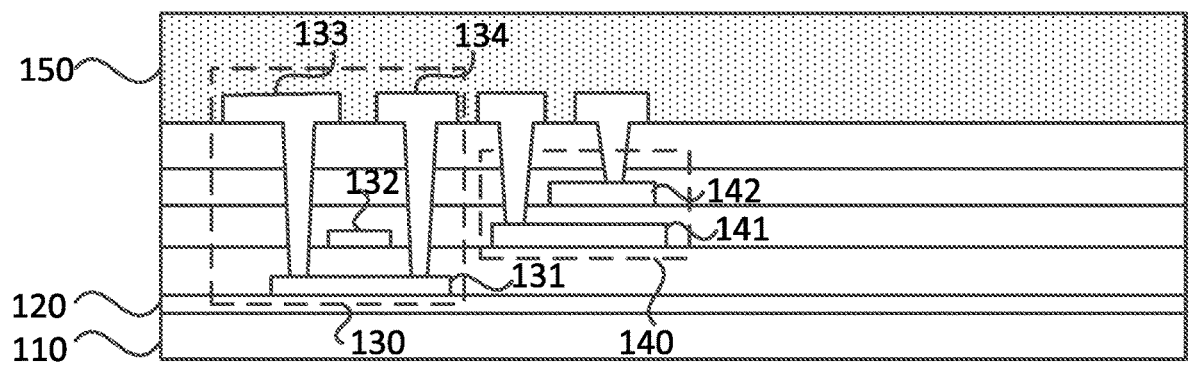
FIG. 2 is a schematic view showing a structure after a planarization layer is formed according to an embodiment of the present disclosure.

In an embodiment, before step S112, the method may further include: a driver circuit layer is formed on a side of the base substrate. Exemplarily, FIG. 2 is a schematic view showing a structure after a planarization layer is formed according to an embodiment of the present disclosure. Referring to FIG. 2, the driver circuit layer is disposed between the planarization layer 150 and the base substrate 110, the driver circuit layer includes an active layer, a gate electrode metal layer, a capacitor metal layer and a source-drain metal layer, and an insulating layer is disposed between the active layer and the gate electrode metal layer and between adjacent metal layers. The driver circuit layer further includes thin film transistors 130 and capacitors 140. The thin film transistor 130 includes a channel 131, a gate electrode 132, a first electrode 133 (for example, a drain electrode) and a second electrode 134 (for example, a source electrode). The capacitor 140 includes a first capacitor plate 141 and a second capacitor plate 142. The channel 131 may be disposed in the active layer, the gate electrode 132 and the first capacitor plate 141 may be disposed in the gate electrode metal layer (the film layer in which the gate electrode 132 is disposed), the second capacitor plate 142 may be disposed in the capacitor metal layer, and the first electrode 133 and the second electrode 134 may be disposed in the source-drain metal layer. It should be noted that FIG. 2 only, exemplarily, shows a specific implementation of a driver circuit layer, but not limits the embodiments of the present disclosure, and may set the specific film layer structure of a driver circuit layer according to practical situations. In addition, the material of each film layer in the driver circuit layer and the film forming process may all be set according to practical situations and are not limited herein.

In step S113, a first film layer is formed on a side of the planarization layer facing away from the base substrate.

The material of the first film layer includes a non-metallic material. The thickness, material and film forming process of the first film layer may all be set according to practical situations and are not limited herein. Exemplarily, the first film layer may include an organic material, and the first film layer may be formed by coating. The first film layer may further include an inorganic material, and the first film layer may be formed by deposition.

Figure 3:
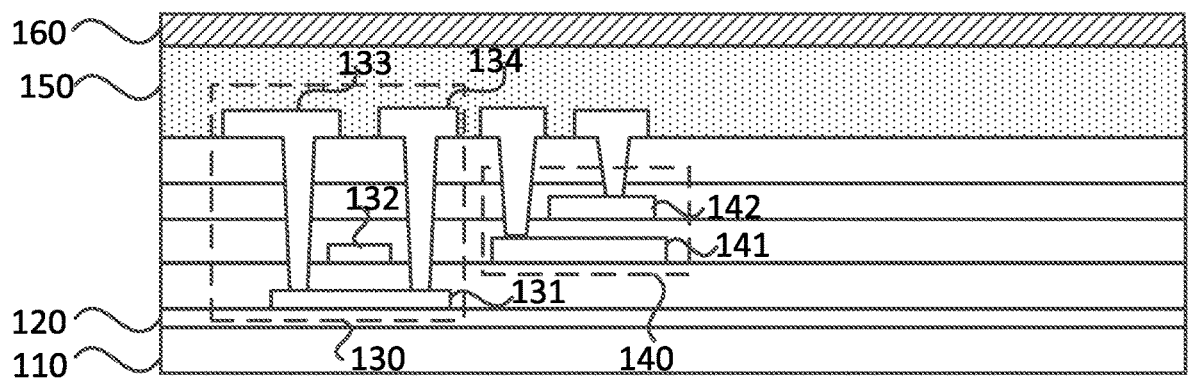
FIG. 3 is a schematic view showing a structure after a first film layer is formed according to an embodiment of the present disclosure.

Exemplarily, FIG. 3 is a schematic view showing a structure after a first film layer is formed according to an embodiment of the present disclosure. As shown in FIG. 3, the first film layer 160 is disposed on the side of the planarization layer 150 facing away from the base substrate 110.

In step S114, an anode via penetrating through the first film layer and the planarization layer is formed.

In one embodiment, the forming process of the anode via H may be set according to practical situations and is not limited herein. Exemplarily, the first film layer 160 may be formed with a via by dry etching or wet etching, and the planarization layer 150 may be formed with a via by dry etching.

Figure 4:
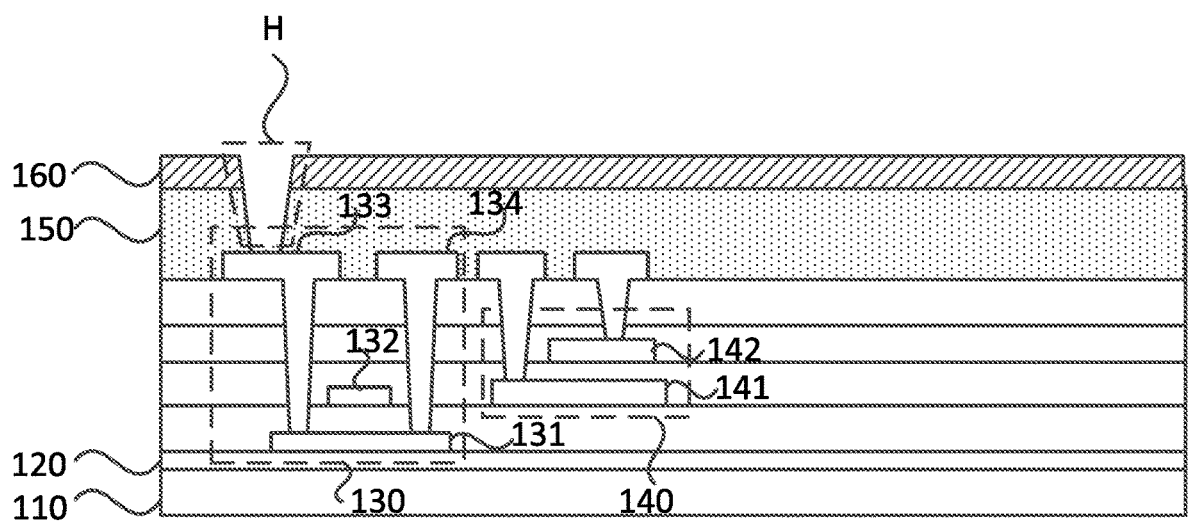
FIG. 4 is a schematic view showing a structure after an anode via is formed according to an embodiment of the present disclosure.

Exemplarily, FIG. 4 is a schematic view showing a structure after an anode via is formed according to an embodiment of the present disclosure. Referring to FIG. 4, the anode via H penetrates through the first film layer 160 and the planarization layer 150, so that the first electrode 113 of the thin film transistor 130 is exposed.

In step S115, an anode layer is formed on a side of the first film layer facing away from the base substrate.

In one embodiment, the material and specific film layer structure of the anode layer may be set according to practical situations and are not limited herein. Exemplarily, the anode layer may be an indium tin oxide-silver-indium tin oxide three-layer structure, and the anode layer may be formed by sputtering.

Figure 5:
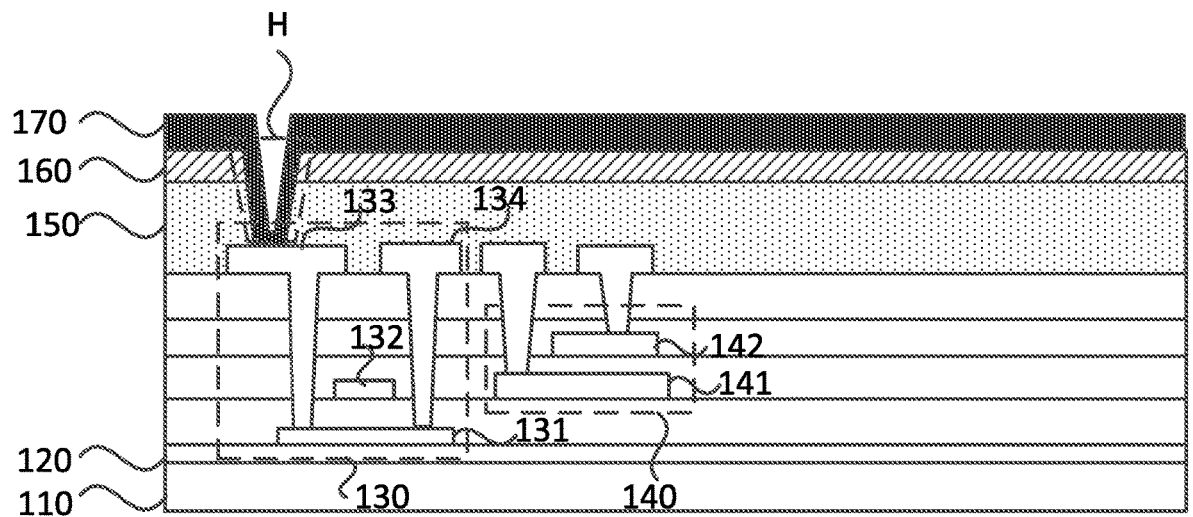
FIG. 5 is a schematic view showing a structure after an anode layer is formed according to an embodiment of the present disclosure.

Exemplarily, FIG. 5 is a schematic view showing a structure after an anode layer is formed according to an embodiment of the present disclosure. Referring to FIG. 5, the anode layer 170 may be filled in the anode via H and is electrically connected to the first electrode 133 exposed by the anode via H.

In step S116, the anode layer is patterned to form a first opening on the anode layer.

The first opening penetrates through the anode layer 170, so that the complete anode layer 170 is divided into independent blocky structures (i.e., anodes). The size of the first opening and the specific patterning process of the anode layer 170 may be set according to practical situations and are not limited herein. Exemplarily, the anode layer 170 may be formed with the first opening by wet etching.

Figure 6:
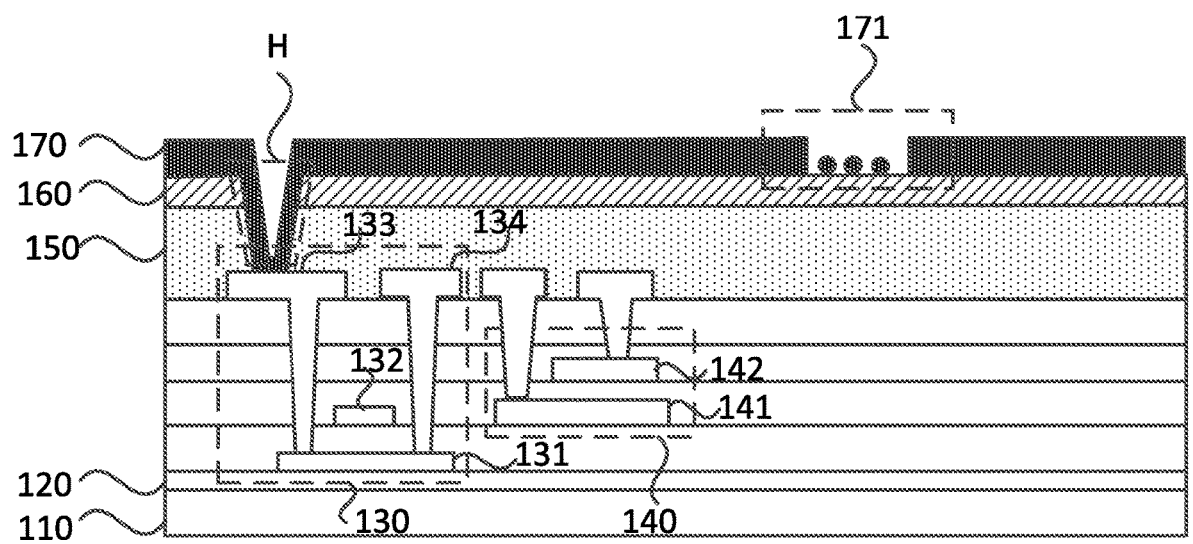
FIG. 6 is a schematic view showing a structure after a first opening is formed according to an embodiment of the present disclosure.

Exemplarily, FIG. 6 is a schematic view showing a structure after forming a first opening is formed according to an embodiment of the present disclosure. Referring to FIG. 6, it is to be understood that when the anode layer 170 includes a metallic material (for example, silver), after the first opening 171 is formed on the anode layer 170, metal ions (for example, silver ions) will remain on the first film layer 160 exposed by the first opening 171.

In step S117, after the anode layer is patterned, the first film layer is patterned to form a second opening on the first film layer.

In one embodiment, the size of the second opening and the specific patterning process of the first film layer 160 may be set according to practical situations and are not limited herein. Exemplarily, the first film layer 160 may be formed with the second opening by dry etching or wet etching.

Figure 7:
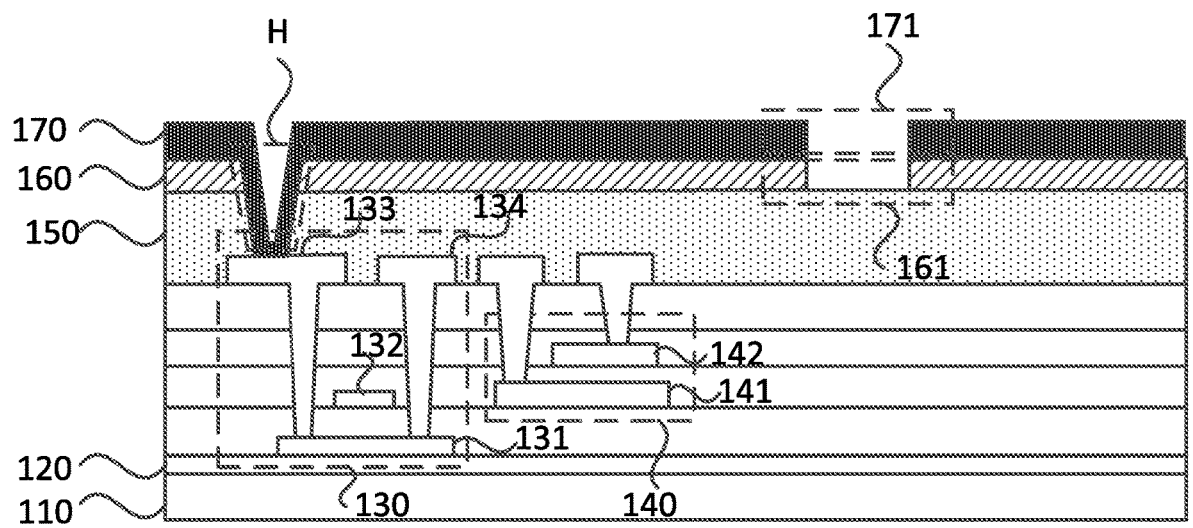
FIG. 7 is a schematic view showing a structure after a second opening is formed according to an embodiment of the present disclosure.

Exemplarily, FIG. 7 is a schematic view showing a structure after a second opening is formed according to an embodiment of the present disclosure. Referring to FIG. 7, it is to be understood that when the first film layer 160 includes the non-metallic material, the etching process of the first film layer may carry away at least part of the metal ions remaining on the first film layer 160 and new metal ions will not be bring about.

The second opening 161 at least partially penetrates through the first film layer 160. The ratio P of the depth of the second opening 161 to the thickness of the first film layer 160 along a direction perpendicular to a plane where the first film layer 160 is located may be set according to practical situations and is not limited herein. Exemplarily, the second opening 161 may partially penetrate through the first film layer 160, that is, the ratio P is greater than 0 and smaller than 1; the second opening 161 may further completely penetrate through the first film layer 160, that is, the ratio P is equal to 1 (as shown in FIG. 7). In an embodiment, when the material of the first film layer 160 includes the inorganic material, the second opening 161 partially penetrates through the first film layer 160, the first film layer 160 under the first opening 171 is not completely removed but thinned, so that the planarization layer 150 under the first opening 171 is still covered with the first film layer 160 made of the inorganic material. Since the inorganic material has a strong capability of blocking water and oxygen, it is advantageous to prevent external moisture from intruding into the planarization layer 150 at the first opening 171, so that the capability of the display panel to block water and oxygen is improved. In an embodiment, when the material of the first film layer 160 includes the organic material, the second opening 161 completely penetrates through a second film layer. Therefore, even if the remaining metal ions permeate from the surface of the first film layer 160 to the inside, it is ensured that the metal ions can be carried away from the display panel along with the etching of the first film layer 160, so that the removal strength of the metal ions is improved, the probability and the quantity of the metal ions remaining are reduced, and the risk of poor display is further reduced.

An orthographic projection of the second opening 161 on the base substrate 110 at least partially overlaps an orthographic projection of the first opening 171 on the base substrate 110. The degree of the orthographic projection of the second opening 161 on the base substrate 110 overlapping the orthographic projection of the first opening 171 on the base substrate 110 may be set according to practical situations and is not limited herein. In one embodiment, the orthographic projection of the second opening 161 on the base substrate 110 overlaps the orthographic projection of the first opening 171 on the base substrate 110 (as shown in FIG. 7). Therefore, no matter where the metal ions remain on the first film layer 160 exposed by the first opening 171, the metal ions are removed along with the forming process of the second opening 161 on the first film layer 160, so that the removal strength of the metal ions is improved, the probability and the quantity of the metal ions remaining are reduced, and the risk of poor display is further reduced.

According to the manufacturing method of a display panel provided by the embodiments of the present disclosure, the first film layer 160 is formed before the anode layer 170 is formed, so that metal ions remaining after the first opening 171 is formed by etching the anode layer 170 fall on the first film layer 160 exposed by the first opening 171; then, the first film layer 160 exposed by the first opening 171 is at least partially removed, so that at least part of the metal ions remaining on the first film layer 160 is removed, and the effect of reducing the risk of metal ions remaining and improving the production yield of the display panel is achieved.

In an embodiment, step S116 includes the steps described below.

In step S1161, a photoresist layer is coated on a side of the anode layer facing away from the base substrate.

In one embodiment, the material of the photoresist and the specific coating mode may be set according to practical situations and are not limited herein. Exemplarily, the material of the photoresist layer may be positive photoresist or negative photoresist, and the photoresist layer may be formed by spin coating.

Figure 8:
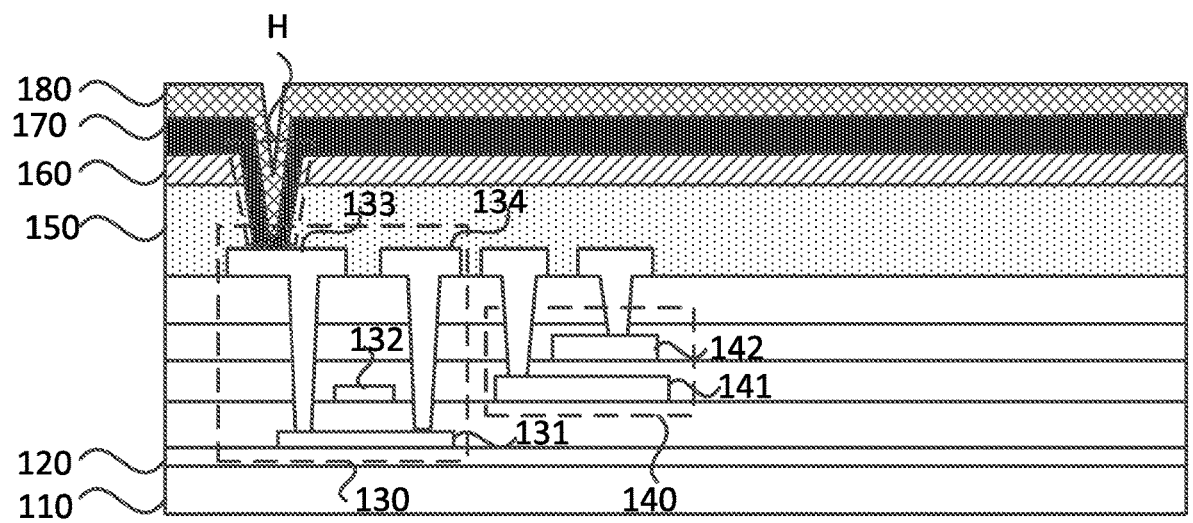
FIG. 8 is a schematic view showing a structure after a photoresist layer is formed according to an embodiment of the present disclosure.

Exemplarily, FIG. 8 is a schematic view showing a structure after a photoresist layer is formed according to an embodiment of the present disclosure. As shown in FIG. 8, the photoresist layer 180 is coated on the side of the planarization layer 170 facing away from the base substrate 110.

In step S1162, the photoresist layer is patterned to form a photoresist pattern.

Figure 9:
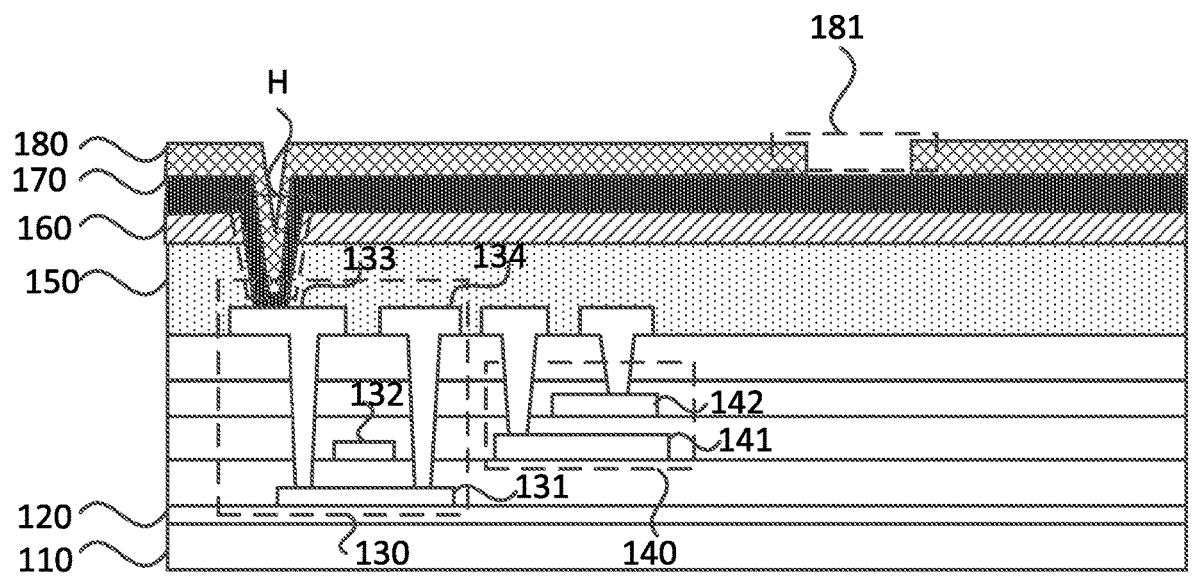
FIG. 9 is a schematic view showing a structure after a photoresist layer is patterned according to an embodiment of the present disclosure.

Exemplarily, FIG. 9 is a schematic view showing a structure after a photoresist layer is patterned according to an embodiment of the present disclosure. Referring to FIG. 9, after a exposure and a development processes are performed on the photoresist layer 180, a third opening 181 may be formed on the photoresist layer 180 for exposing a position on the anode layer 170 to be etched, so that the anode layer 170 is subsequently etched to form the first opening 171.

In step S1163, the anode layer is etched by using the photoresist pattern as a mask plate to form the first opening on the anode layer.

Figure 10:
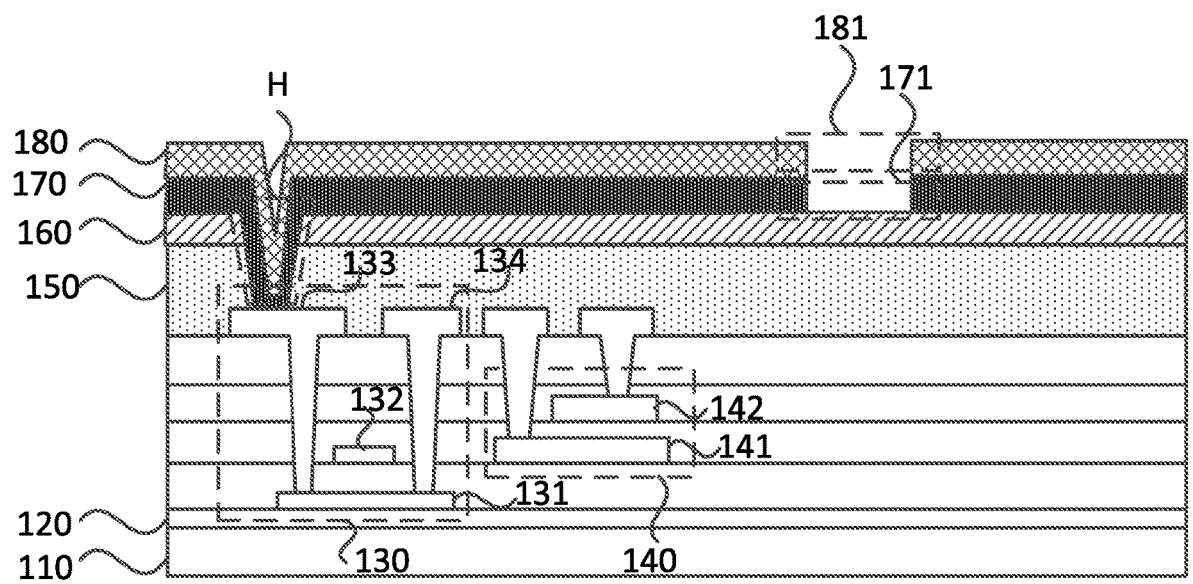
FIG. 10 is a schematic view showing another structure after a first opening is formed according to an embodiment of the present disclosure.

Exemplarily, FIG. 10 is a schematic view showing another structure after a first opening is formed according to an embodiment of the present disclosure. Referring to FIG. 10, in the anode layer, the part covered by the photoresist layer 180 is left, and the part exposed by the third opening 181 is etched to form the first opening 171.

In one embodiment, the implementation in which the second opening 161 is formed on the first film layer 160 is related to the material of the first film layer 160, and typical examples are described below according to the classification of the material of the first film layer 160 but do not limit the present disclosure.

In a first type, in an embodiment, the material of the first film layer 160 is different from the material of the photoresist layer 180.

In an embodiment, the material of the first film layer 160 may include the organic material or the inorganic material different from the material of the photoresist layer 180. Exemplarily, when the first film layer 160 includes the organic material, polyimide, polyethylene terephthalate, polycarbonate, polyethylene or polyacrylate and the like may be used; when the first film layer 160 includes the inorganic material, silicon oxide, silicon nitride, silicon oxynitride, silicon carbide and the like may be used. It is to be understood that the display panel generally includes film layers manufactured and formed of the organic material or the inorganic material. For example, the material of the planarization layer 150 is generally the organic material, and the insulating layer spaced between adjacent metal layers in the driver circuit layer is generally the inorganic material. Therefore, the material of the first film layer 160 is set to include the organic material or the inorganic material, and the first film layer 160 may be manufactured and patterned by the related processes, so that the difficulty of manufacturing the first film layer 160 is reduced.

In an embodiment, when the material of the first film layer 160 includes the organic material or the inorganic material, the step of after the anode layer is patterned, the first film layer is patterned to form the second opening may include: after the anode layer 170 is patterned, the first film layer 160 is dry etched to form the second opening 161 on the first film layer 160. The gas flow during the dry etching process is greater than a preset gas flow threshold.

In one embodiment, the specific value of the preset gas flow threshold may be set according to practical situations and is not limited herein. It is to be understood that when the gas flow during the dry etching process is greater than the preset gas flow threshold, the metal ions adhered to the first film 160 may be discharged along with the etched material of the first film 160 driven by the large gas flow out of the dry etching equipment, so that it is ensured that the remaining metal ions are carried away from the display panel.

Figure 11:
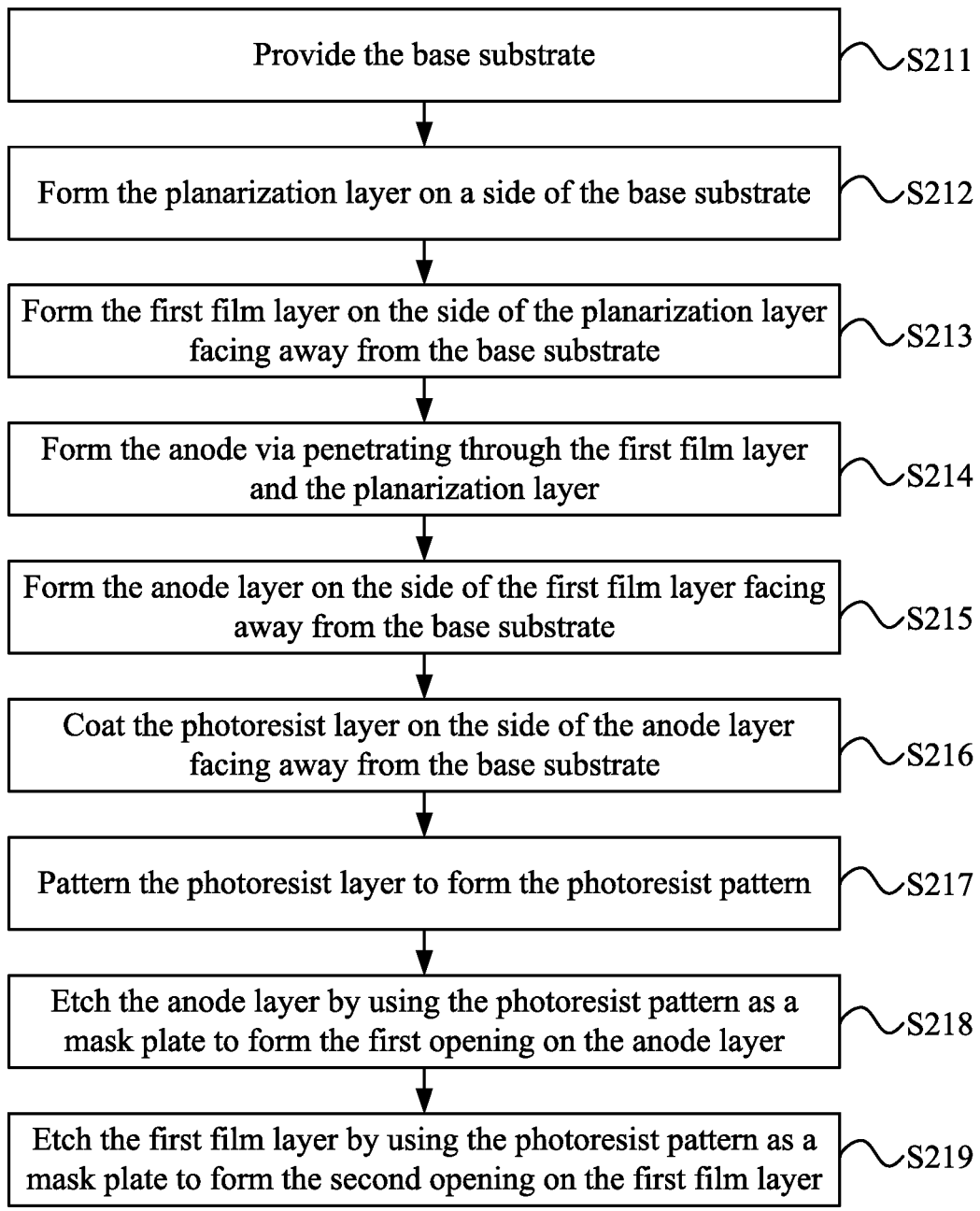
FIG. 11 is a flowchart of another manufacturing method of a display panel according to an embodiment of the present disclosure.

FIG. 11 is a flowchart of another manufacturing method of a display panel according to an embodiment of the present disclosure. Referring to FIG. 11, the manufacturing method of a display panel includes the steps described below.

In step S211, the base substrate is provided.

In step S212, the planarization layer is formed on a side of the base substrate, as shown in FIG. 2.

In step S213, the first film layer is formed on the side of the planarization layer facing away from the base substrate, as shown in FIG. 3.

In step S214, the anode via penetrating through the first film layer and the planarization layer is formed, as shown in FIG. 4.

In step S215, the anode layer is formed on the side of the first film layer facing away from the base substrate, as shown in FIG. 5.

In step S216, the photoresist layer is coated on the side of the anode layer facing away from the base substrate, as shown in FIG. 8.

In step S217, the photoresist layer is patterned to form the photoresist pattern, as shown in FIG. 9.

In step S218, the anode layer is etched by using the photoresist pattern as a mask plate to form the first opening on the anode layer, as shown in FIG. 10.

In step S219, the first film layer is etched by using the photoresist pattern as a mask plate to form the second opening on the first film layer.

Figure 12:
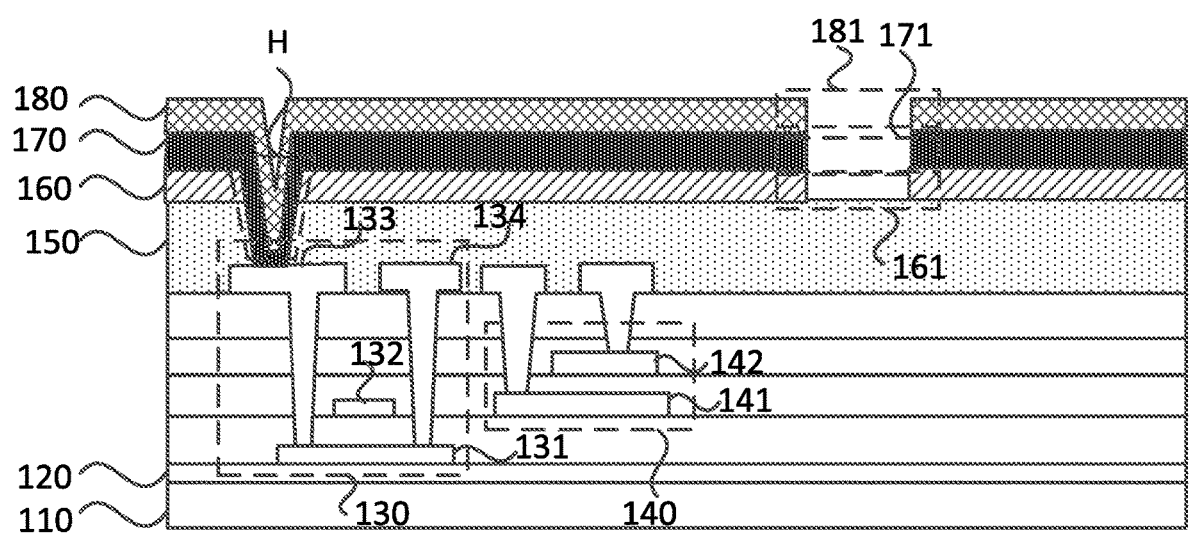
FIG. 12 is a schematic view showing another structure after a second opening is formed according to an embodiment of the present disclosure.

Exemplarily, FIG. 12 is a schematic view showing another structure after a second opening is formed according to an embodiment of the present disclosure. Referring to FIG. 12, in the first film layer 160, the part covered by the photoresist layer 180 is left, and the part exposed by the third opening 181 is etched to form the second opening 161.

It is to be understood that patterning the anode layer 170 and patterning the first film layer 160 use a same mask plate (the photoresist pattern), so that theoretically the orthographic projection of the second opening 161 on the base substrate 110 overlaps the orthographic projection of the first opening 171 on the base substrate 110. Therefore, the removal strength of the metal ions is improved, the probability and the quantity of the metal ions remaining are reduced, and the risk of poor display is further reduced. It is further to be understood that patterning the anode layer 170 and patterning the first film layer 160 use a same mask plate, so that the process of another photoresist pattern manufactured for etching the first film layer 160 to form the second opening 161 may be omitted, that is, the processes of coating, exposure and development of photoresist do not need to be individually performed once more, which is advantageous for simplifying the manufacturing process of the display panel and improving the production efficiency.

In an embodiment, the manufacturing method of a display panel further includes the steps described below.

In step S221, the photoresist layer is stripped. In one embodiment, the specific mode of stripping the photoresist layer 180 may be set according to practical situations and is not limited herein. Exemplarily, the photoresist layer 180 may be removed by organic chemical cleaning or other methods in accordance with the embodiments of the disclosure. The structural view of the display panel after the photoresist layer 180 is stripped may be seen in FIG. 7.

Figure 13:
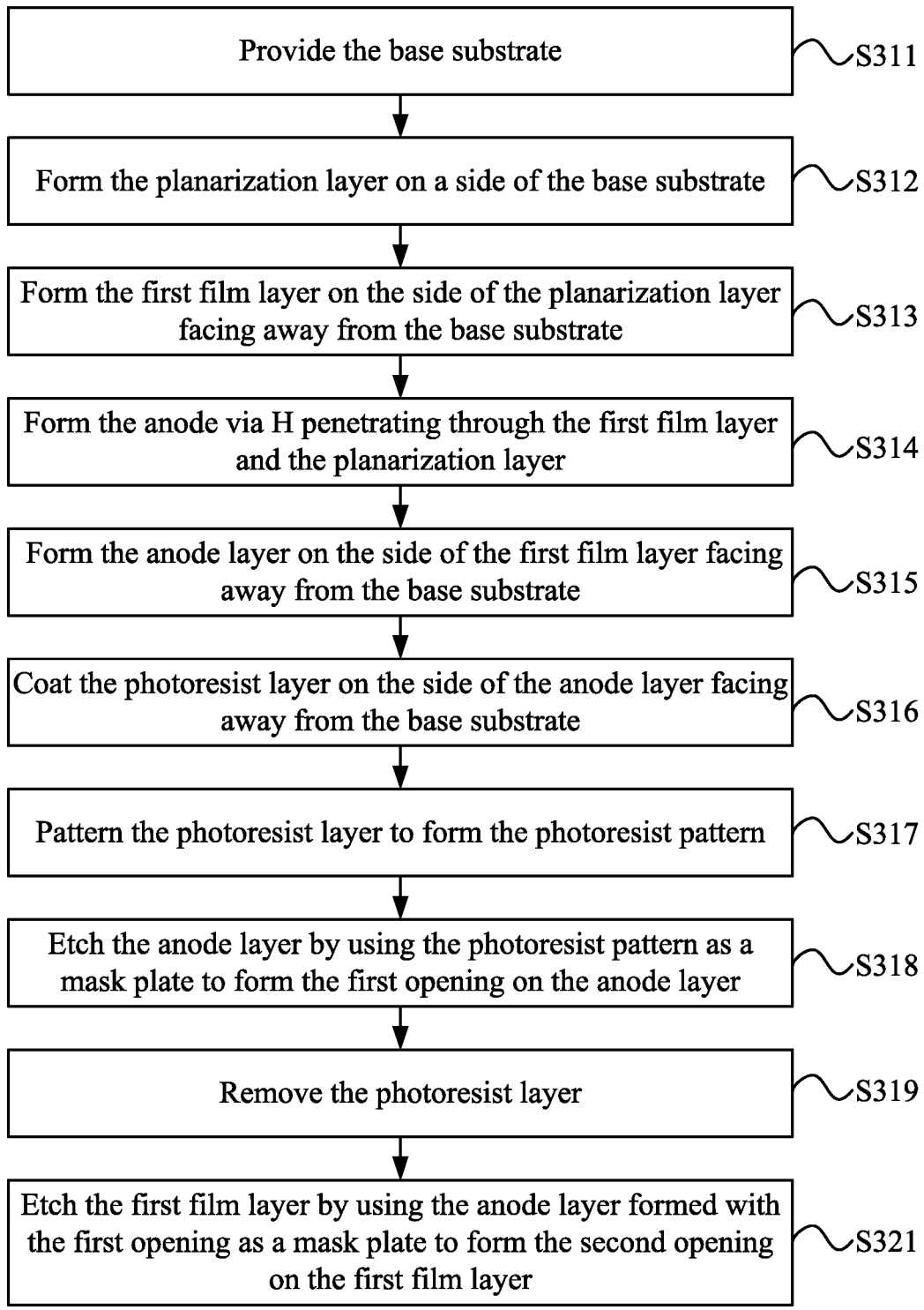
FIG. 13 is a flowchart of another manufacturing method of a display panel according to an embodiment of the present disclosure.

FIG. 13 is a flowchart of another manufacturing method of a display panel according to an embodiment of the present disclosure. Referring to FIG. 13, the manufacturing method of a display panel includes the steps described below.

In step S311, the base substrate is provided.

In step S312, the planarization layer is formed on a side of the base substrate.

In step S313, the first film layer is formed on the side of the planarization layer facing away from the base substrate.

Figure 14:
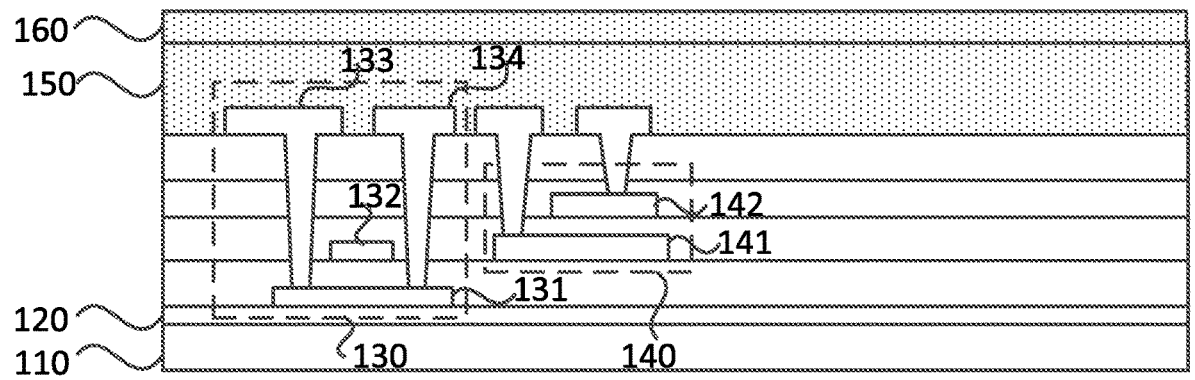
FIG. 14 is a schematic view showing another structure after a first film layer is formed according to an embodiment of the present disclosure.

Exemplarily, FIG. 14 is a schematic view showing another structure after a first film layer is formed according to an embodiment of the present disclosure. Referring to FIG. 14, in an embodiment, the first film layer 160 includes the organic material, and the material of the planarization layer 150 is the same as the material of the first film layer 160. The planarization layer 150 and the first film layer 160 are formed by a same manufacturing process. In other words, after the material of the planarization layer 150 is deposited on a side of the base substrate 110 to the thickness required for the planarization layer 150, the material of the planarization layer 150 is continuously deposited to the thickness required for the first film layer 160, that is, the manufacturing of the planarization layer 150 and the first film layer 160 is completed. In this way, the planarization layer 150 and the first film layer 160 may be formed by a same manufacturing process, which is advantageous for simplifying the manufacturing process of the display panel and reducing the cost. It is to be noted that in FIG. 14, for ease of the illustration of the planarization layer 150 and the first film layer 160, a boundary between the planarization layer 150 and the first film layer 160 is shown. However, in a real display panel product, generally no film boundary exists between the planarization layer 150 and the first film layer 160.

In step S314, the anode via H penetrating through the first film layer and the planarization layer is formed.

Figure 15:
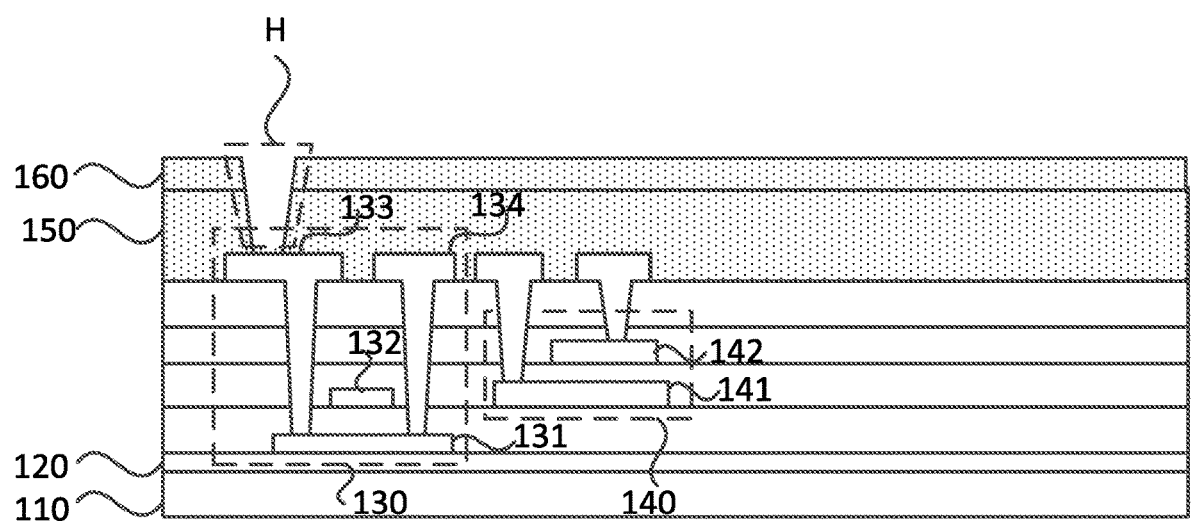
FIG. 15 is a schematic view showing another structure after an anode via is formed according to an embodiment of the present disclosure.

Exemplarily, FIG. 15 is a schematic view showing another structure after an anode via is formed according to an embodiment of the present disclosure. Referring to FIG. 15, it should be understood that when the material of the planarization 150 is the same as the material of the first film layer 160, the first film layer 160 and the planarization layer 150 may be formed with a via by a same etching process to obtain the anode via H, so that it is not necessary to separately etch the first film layer 160 and the planarization layer 150 in two processes, thus further simplifying the manufacturing process of the display panel and further reducing the cost.

In step S315, the anode layer is formed on the side of the first film layer facing away from the base substrate.

Figure 16:
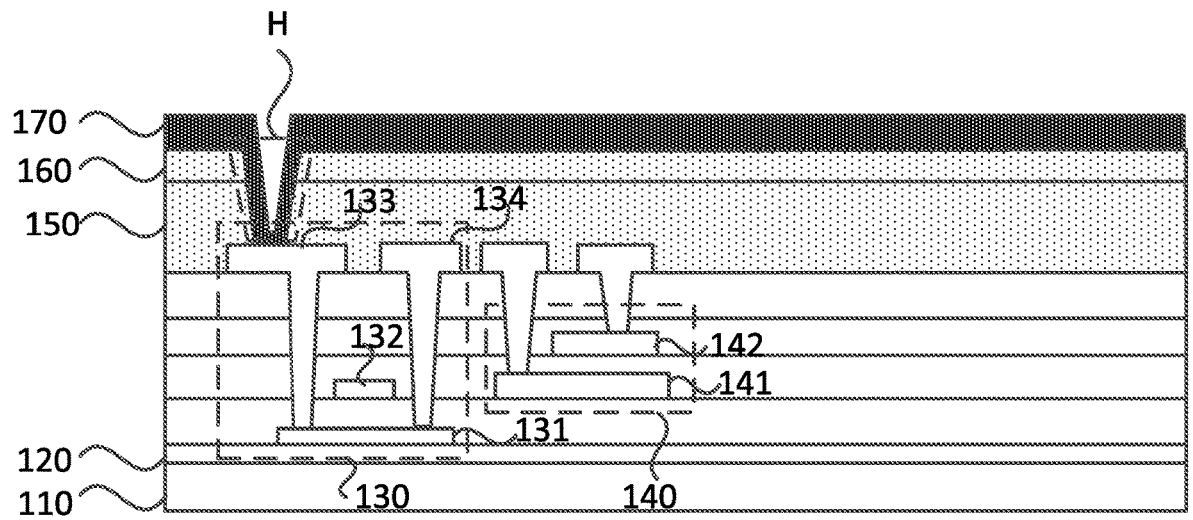
FIG. 16 is a schematic view showing another structure after an anode layer is formed according to an embodiment of the present disclosure.

Exemplarily, FIG. 16 is a schematic view showing another structure after an anode layer is formed according to an embodiment of the present disclosure.

In step S316, the photoresist layer is coated on the side of the anode layer facing away from the base substrate.

In step S317, the photoresist layer is patterned to form the photoresist pattern.

In step S318, the anode layer is etched by using the photoresist pattern as a mask plate to form the first opening on the anode layer.

Figure 17:
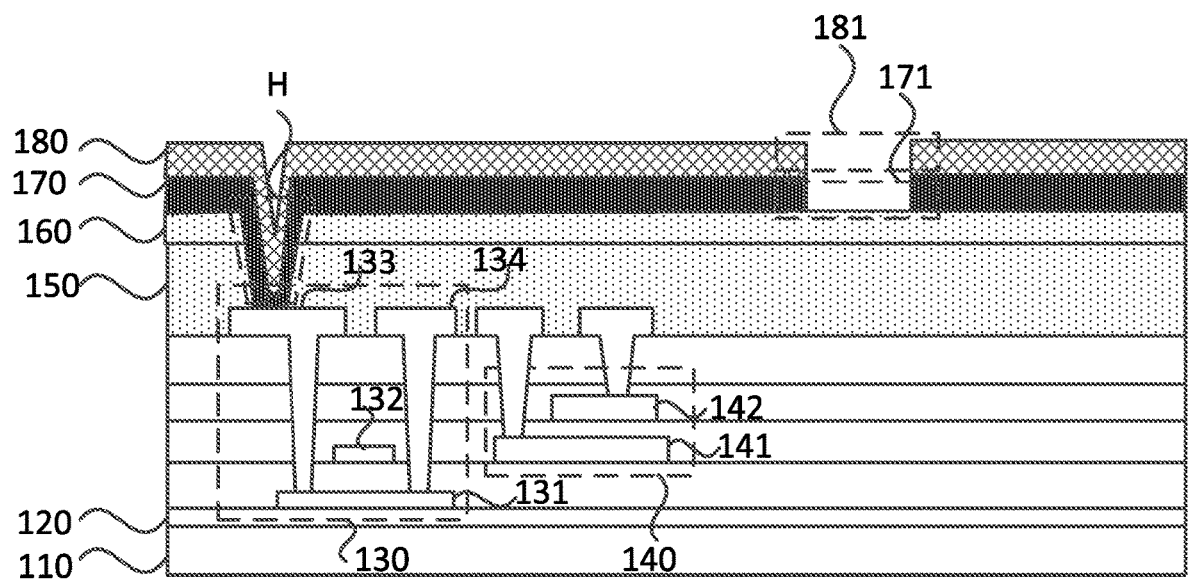
FIG. 17 is a schematic view showing another structure after a first opening is formed according to an embodiment of the present disclosure.

Exemplarily, FIG. 17 is a schematic view showing another structure after a first opening is formed according to an embodiment of the present disclosure. As shown in FIG. 17, the first opening 171 penetrates through the anode layer 170.

In step S319, the photoresist layer is removed.

Figure 18:
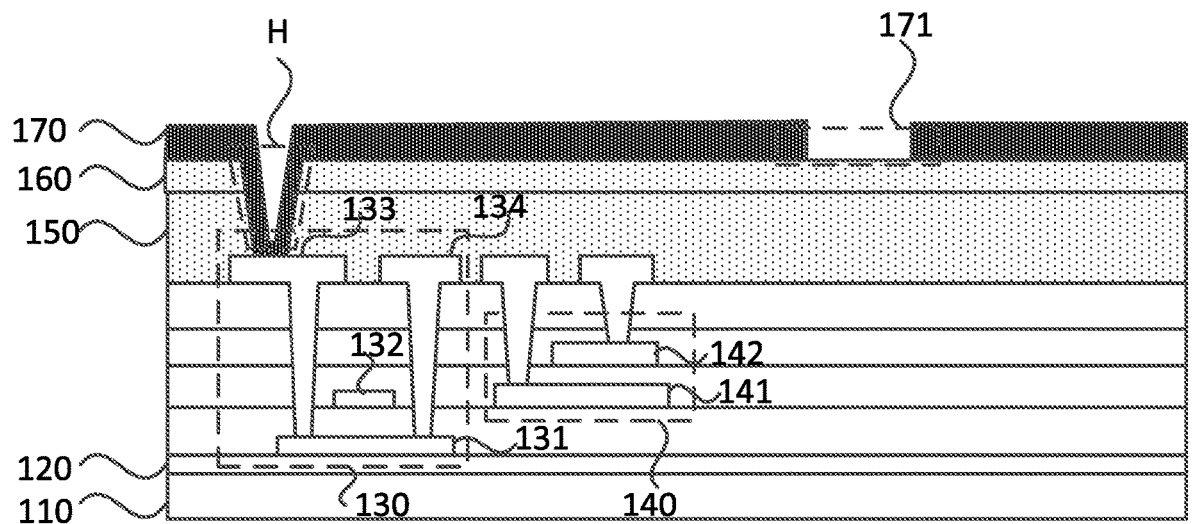
FIG. 18 is a schematic view showing a structure after a photoresist layer is removed according to an embodiment of the present disclosure.

Exemplarily, FIG. 18 is a schematic view showing a structure after a photoresist layer is removed according to an embodiment of the present disclosure.

In step S321, the first film layer is etched by using the anode layer formed with the first opening as a mask plate to form the second opening on the first film layer.

In one embodiment, the material of the first film layer 160 includes the organic material or the inorganic material, and the patterning mode of the first film layer 160 may by dry etching. The etching gas used in dry etching process may be set according to actual situations as long as the etching gas does not react with the anode layer 170.

Figure 19:
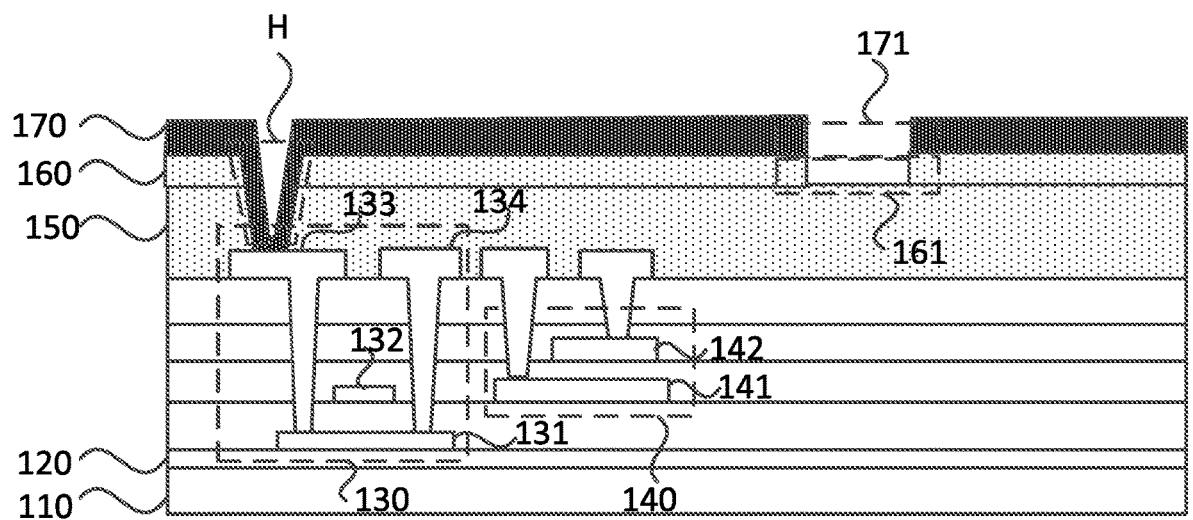
FIG. 19 is a schematic view showing another structure after a second opening is formed according to an embodiment of the present disclosure.

Exemplarily, FIG. 19 is a schematic view showing another structure after a second opening is formed according to an embodiment of the present disclosure. Referring to FIG. 19, in the first film layer 160, the part covered by the anode layer 170 is left, and the part exposed by the first opening 171 is etched to form the second opening 161.

It is to be understood that the first film layer 170 is etched by using the anode layer 170 formed with the first opening 171 as a mask plate, so that theoretically the orthographic projection of the second opening 161 on the base substrate 110 overlaps the orthographic projection of the first opening 171 on the base substrate 110. Therefore, the removal strength of the metal ions is improved, the probability and the quantity of the metal ions remaining are reduced, and the risk of poor display is further reduced. It is further to be understood that the first film layer 160 is etched by using the anode layer 170 formed with the first opening 171 as a mask plate, so that the process of another photoresist pattern manufactured for etching the first film layer 160 to form the second opening 161 may be omitted, that is, the processes of coating, exposure and development of photoresist do not need to be individually performed once more, which is advantageous for simplifying the manufacturing process of the display panel and improving the production efficiency. It is further to be understood that the first film layer 160 is etched by using the anode layer 170 formed with the first opening 171 as a mask plate, so that the anode layer 170 is covered above by the photoresist layer 180, and thus it is avoided that the anode layer 170 is etched by mistake during the etching process of the first film layer 160.

In a second type, the material of the first film layer 160 is the same as the material of the photoresist layer 180.

It is to be understood that the material of the first film layer 160 is the same as the material of the photoresist layer 180, so that the first film layer 160 may be manufactured and patterned by the related processes, and thus the difficulty of manufacturing the first film layer 160 is reduced.

Figure 20:
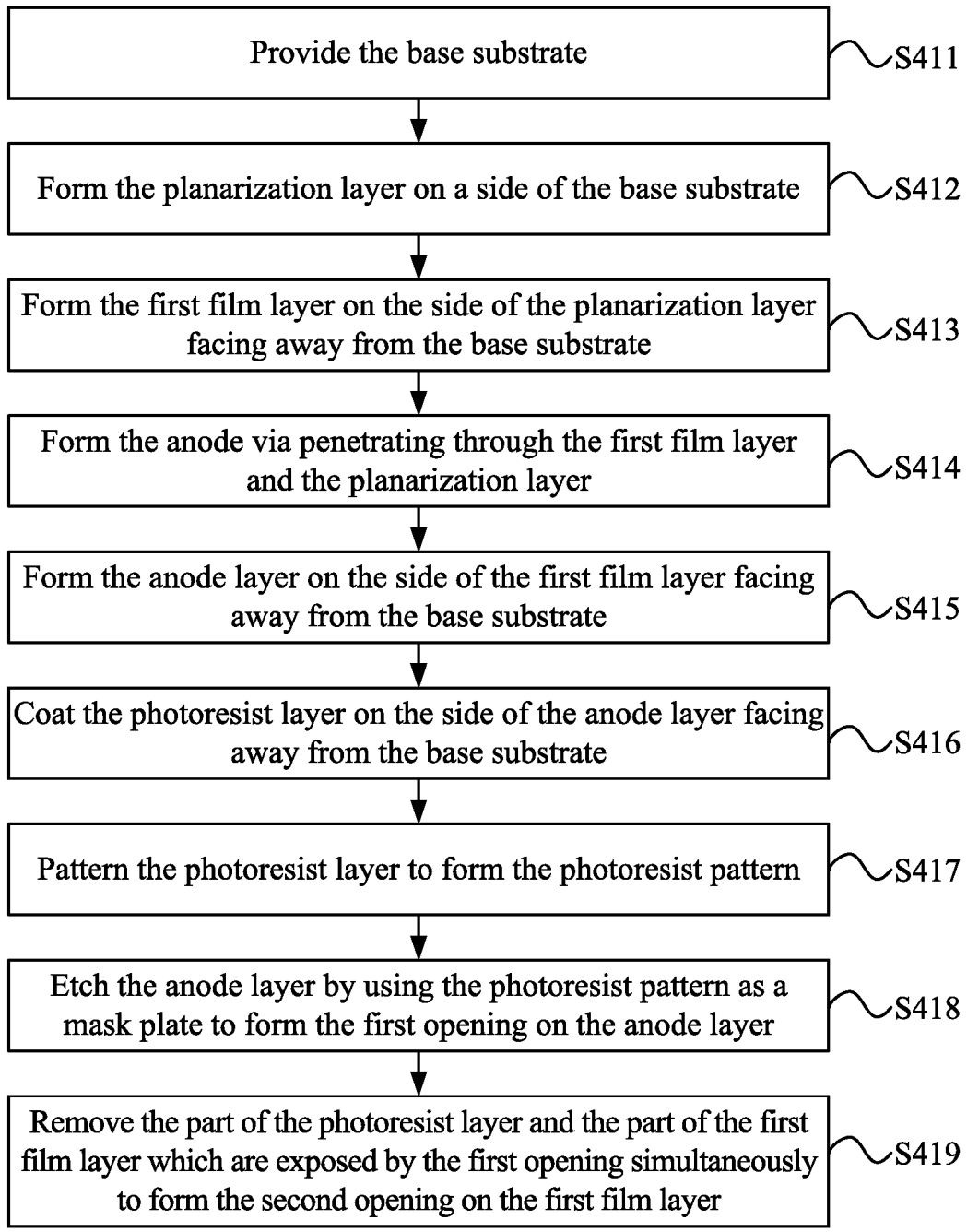
FIG. 20 is a flowchart of another manufacturing method of a display panel according to an embodiment of the present disclosure.

FIG. 20 is a flowchart of another manufacturing method of a display panel according to an embodiment of the present disclosure. Referring to FIG. 20, the manufacturing method of a display panel includes the steps described below.

In step S411, the base substrate is provided.

In step S412, the planarization layer is formed on a side of the base substrate.

In step S413, the first film layer is formed on the side of the planarization layer facing away from the base substrate.

In step S414, the anode via penetrating through the first film layer and the planarization layer is formed.

In step S415, the anode layer is formed on the side of the first film layer facing away from the base substrate.

In step S416, the photoresist layer is coated on the side of the anode layer facing away from the base substrate.

In step S417, the photoresist layer is patterned to form the photoresist pattern.

In step S418, the anode layer is etched by using the photoresist pattern as a mask plate to form the first opening on the anode layer.

Figure 21:
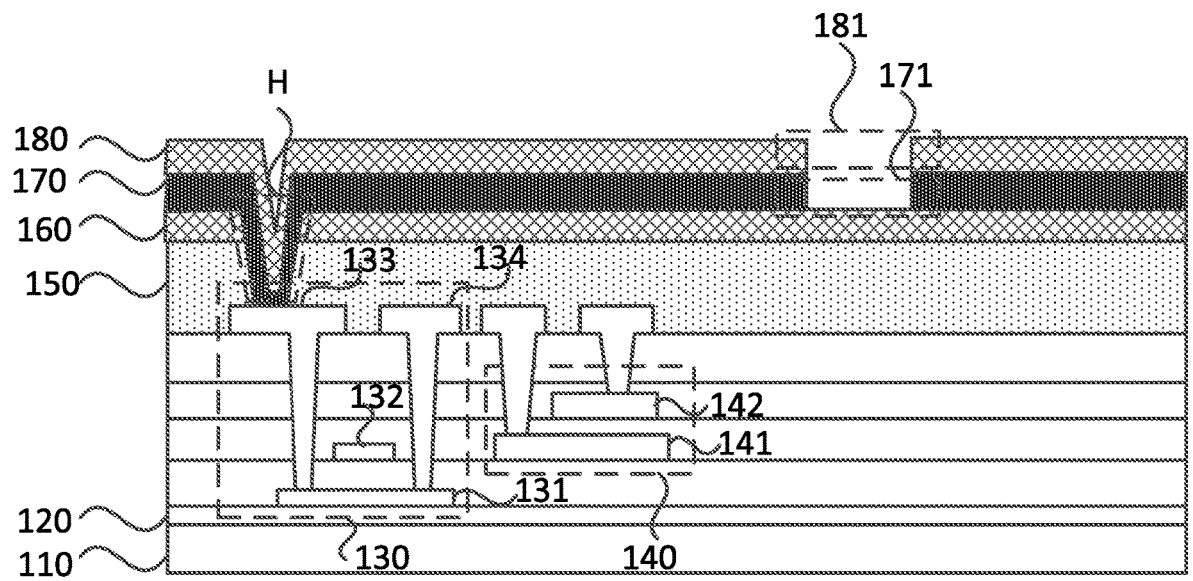
FIG. 21 is a schematic view showing another structure after a first opening is formed according to an embodiment of the present disclosure.

Exemplarily, FIG. 21 is a schematic view showing another structure after a first opening is formed according to an embodiment of the present disclosure.

In step S419, the part of the photoresist layer and the part of the first film layer which are exposed by the first opening are removed simultaneously to form the second opening on the first film layer.

In one embodiment, the specific mode of removing the part of the photoresist layer 180 and the part of the first film layer 160 which are exposed by the first opening 171 may be set according to actual situations and is not limited herein. Exemplarily, organic chemical cleaning or other methods according to embodiments of the disclosure.

Figure 22:
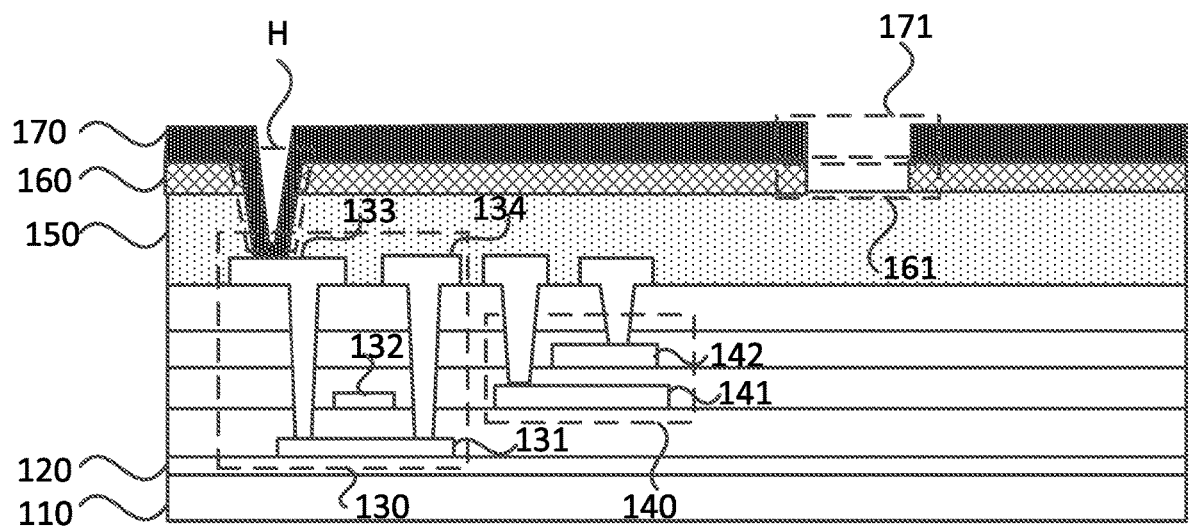
FIG. 22 is another schematic view showing a structure after a photoresist layer is removed according to an embodiment of the present disclosure.

Exemplarily, FIG. 22 is a schematic view showing another structure after a photoresist layer is removed according to an embodiment of the present disclosure. Referring to FIG. 22, since the material of the first film layer 160 is the same as the material of the photoresist layer 180, when the first film layer 160 exposed by the first opening 171 is cleaned with an organic chemical solution, the photoresist layer 180 disposed above the anode layer 170 can be cleaned and removed together. In this way, it is not necessary to individually set a process special for stripping the photoresist layer 180, which is advantageous for simplifying the manufacturing process of the display panel and reducing the cost.

Based on the same inventive concept, the embodiments of the present disclosure further provide a display panel. With continued reference to FIG. 7, FIG. 19 and FIG. 21, the display panel includes the base substrate 110 and the planarization layer 150 and the first film layer 160 and the anode layer 170. The planarization layer 150 is disposed on a side of the base substrate 110. The first film layer 160 is disposed on the side of the planarization layer 150 facing away from the base substrate 110, and the anode layer 170 is disposed on the side of the first film layer 160 facing away from the base substrate 110. The anode via H is provided in the first film layer 160 and the planarization layer 150, and the anode layer is filled in the anode via H. The anode layer 170 is provided with the first opening 171, and the first opening 171 penetrates through the anode layer 170. The first film layer 160 is provided with the second opening 161, and the second opening 161 at least partially penetrates through the first film layer 160. The material of the first film layer 160 is the non-metallic material. The orthographic projection of the second opening 161 on the base substrate 110 at least partially overlaps the orthographic projection of the first opening 171 on the base substrate 110.

According to the display panel provided by the embodiments of the present disclosure, the first film layer 160 is added under the anode layer 170, so that metal ions remaining after the first opening 171 is formed by etching the anode layer 170 fall on the first film layer 160 exposed by the first opening 171. Then, when the second opening 161 is formed on the first film layer 160, at least part of the metal ions remaining on the first film layer 160 can be carried away from the display panel along with the etched material of the first film layer, and the effect of reducing the risk of metal ions remaining and improving the production yield of the display panel is achieved.

With continued reference to FIG. 7, FIG. 19 and FIG. 21, in an embodiment, the orthographic projection of the second opening 161 on the base substrate 110 overlaps the orthographic projection of the first opening 171 on the base substrate 110. Therefore, no matter where the metal ions remain on the first film layer 160 exposed by the first opening 171, the metal ions are removed along with the forming process of the second opening 161 on the first film layer 160, so that the removal strength of the metal ions is improved, the probability and the quantity of the metal ions remaining are reduced, and the risk of poor display is further reduced.

In an embodiment, the material of the first film layer 160 includes the organic material or the inorganic material.

Exemplarily, when the first film layer 160 is the organic material, polyimide, polyethylene terephthalate, polycarbonate, polyethylene or polyacrylate and the like may be used; when the first film layer 160 is the inorganic material, silicon oxide, silicon nitride, silicon oxynitride, silicon carbide and the like may be used. It is to be understood that the display panel generally includes film layers manufactured and formed of the organic material or the inorganic material. For example, the material of the planarization layer 150 is generally the organic material, and the insulating layer spaced between adjacent metal layers in the driver circuit layer is generally the inorganic material. Therefore, the material of the first film layer 160 is set to include the organic material or the inorganic material, and the first film layer 160 may be manufactured and patterned by the related processes, so that the difficulty of manufacturing the first film layer 160 is reduced.

Figure 23:
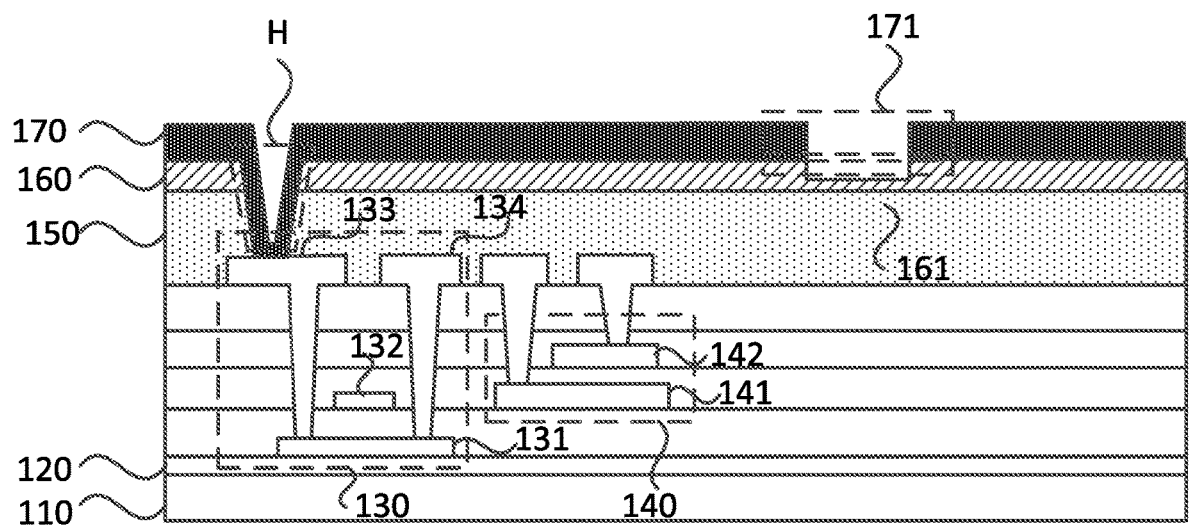
FIG. 23 is a structural view of a display panel according to an embodiment of the present disclosure.

FIG. 23 is a structural view of a display panel according to an embodiment of the present disclosure. Referring to FIG. 23, in an embodiment, the material of the first film layer 160 includes the inorganic material, and the second opening 161 partially penetrates through the first film layer 160. Therefore, the planarization layer 150 under the first opening 171 is covered with the first film layer 160 made of the inorganic material. Since the inorganic material has a strong capability of blocking water and oxygen, it is advantageous to prevent external moisture from intruding into the planarization layer 150 at the first opening 171, so that the capability of the display panel to block water and oxygen is improved In an embodiment, the material of the first film layer 160 includes the organic material, and the second opening 161 penetrates through the first film layer 160. Therefore, even if the remaining metal ions permeate from the surface of the first film layer 160 to the inside, it is ensured that the metal ions can be carried away from the display panel along with the etching of the first film layer 160, so that the removal strength of the metal ions is improved, the probability and the quantity of the metal ions remaining are reduced, and the risk of poor display is further reduced.

With continued reference to FIG. 22, in an embodiment, the material of the first film layer 160 includes the organic material, and the material of the first film layer 160 is the same as the material of the planarization layer 150. In this way, the planarization layer 150 and the first film layer 160 may be formed by a same manufacturing process, which is advantageous for simplifying the manufacturing process of the display panel and reducing the cost. Moreover, when the anode via H penetrating through the first film layer 160 and the planarization layer 150 is formed, the first film layer 160 and the planarization layer 150 may be formed with a via by a same etching process to obtain the anode via H, so that it is not necessary to separately etch the first film layer 160 and the planarization layer 150 in two processes, thus further simplifying the manufacturing process of the display panel and further reducing the cost.

Figure 24:
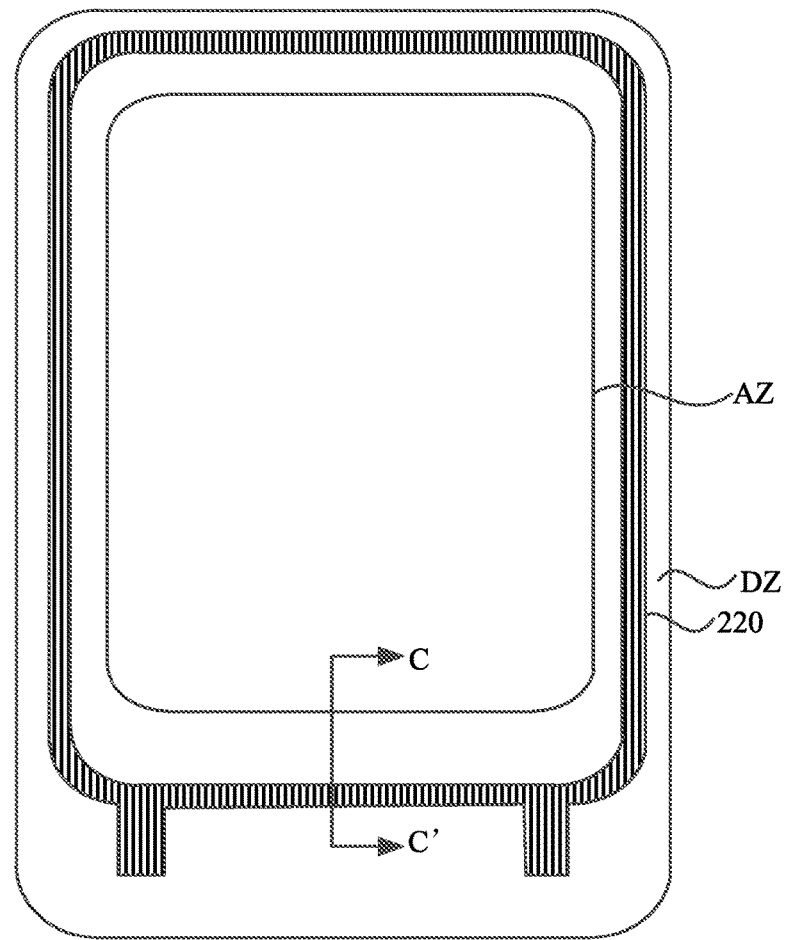
FIG. 24 is a structural view of another display panel according to an embodiment of the present disclosure.
Figure 25:
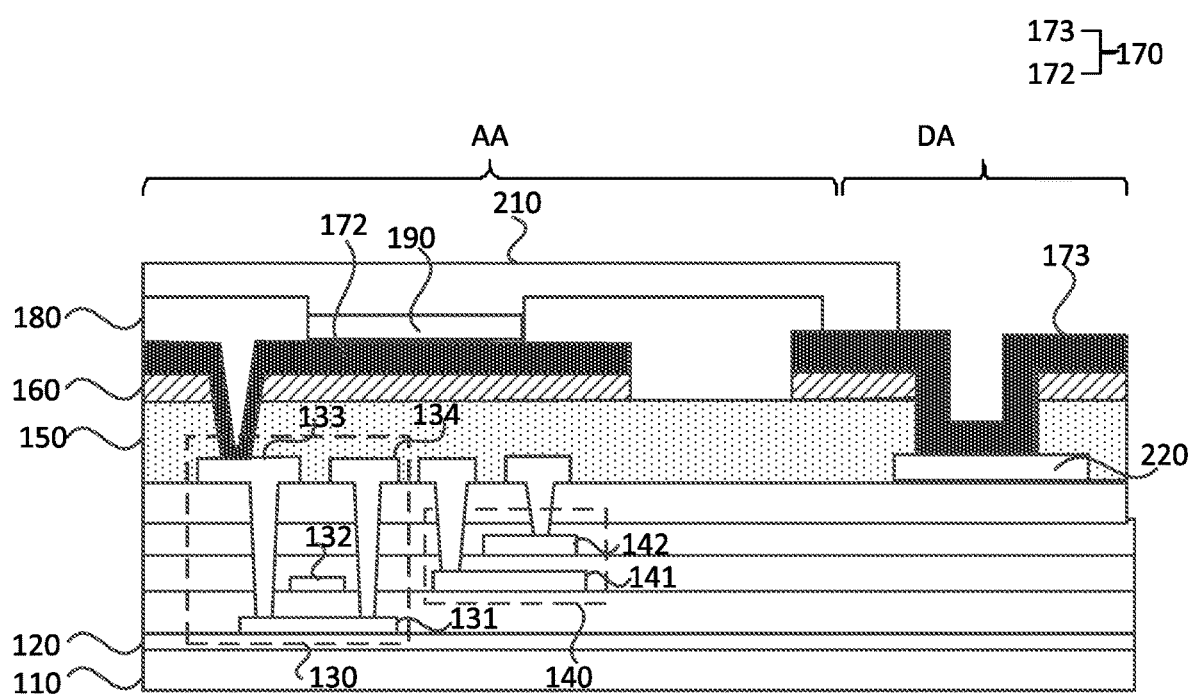
FIG. 25 is a sectional view taken along CC' in FIG. 24.

FIG. 24 is a structural view of another display panel according to an embodiment of the present disclosure. FIG. 25 is a sectional view taken along CC' in FIG. 24. Referring to FIG. 24 and FIG. 25, in an embodiment, the display panel further includes the driver circuit layer, the light-emitting layer 190 and the cathode layer 210. The driver circuit layer is disposed between the base substrate 110 and the first film layer 160, the light-emitting layer 190 is disposed on the side of the anode layer 170 facing away from the base substrate 110, and the cathode layer 210 is disposed on a side of the light-emitting layer 190 facing away from the base substrate 110.

In one embodiment, the specific implementation of the driver circuit layer may be set according to actual situations and is not limited herein. Exemplarily, as shown in FIG. 24, the driver circuit layer includes the active layer, the gate electrode metal layer, the capacitor metal layer and the source-drain metal layer, and the insulating layer is disposed between the active layer and the gate electrode metal layer and between adjacent metal layers. The driver circuit layer further includes thin film transistors 130 and capacitors 140. The thin film transistor 130 includes the channel 131, the gate electrode 132, the first electrode 133 (for example, the drain electrode) and the second electrode 134 (for example, the source electrode). The capacitor 140 includes the first capacitor plate 141 and the second capacitor plate 142. The channel 131 may be disposed in the active layer, the gate electrode 132 and the first capacitor plate 141 may be disposed in the gate electrode 132 metal layer, the second capacitor plate 142 may be disposed in the capacitor 140 metal layer, and the first electrode 133 and the second electrode 134 may be disposed in the source-drain metal layer.

With continued reference to FIG. 24 and FIG. 25, in an embodiment, the display panel further includes a display region AZ and a non-display region DZ surrounding the display region AZ. The driver circuit layer includes thin film transistors 130 and a first power signal line 220. The anode layer 170 includes a connection electrode 173 and anodes 172, the anodes 172 are disposed in the display region AZ, the anodes 172 are connected to the thin film transistors 130 through vias, the connection electrode 173 is at least partially disposed in the non-display region DZ, the connection electrode 173 is connected to the first power signal line 220 through a via, and the connection electrode 173 is connected to the cathode layer 210.

In one embodiment, the first power signal line 220 may be disposed in the gate electrode metal layer, the capacitor metal layer, the source-drain metal layer or other metal layers, which is not limited herein. In an embodiment, the first power signal line 220 is disposed in the source-drain metal layer (as shown in FIG. 25). In this way, the anode via H and the via used for connecting electrode 173 may be formed by a same manufacturing process, which is advantageous for simplifying the manufacturing process of the display panel and reducing the cost.

It should be noted that FIGS. 2 to 10, FIG. 12, FIGS. 14 to 19, FIGS. 21 to 24 further illustrate, exemplarily, that the display panel includes a buffer layer 120 but do not limit the embodiments of the present disclosure, and specific film layers of the display panel may be set according to actual situations.

Based on the same inventive concept, the embodiments of the present disclosure further provide a display device. The display device includes the display panel described by any one of the embodiments of the present disclosure. Therefore, the display device has the beneficial effects of the display panel provided by the embodiments of the present disclosure. The same content may be understood by referring to the above description and will not be repeated herein.

Figure 26:
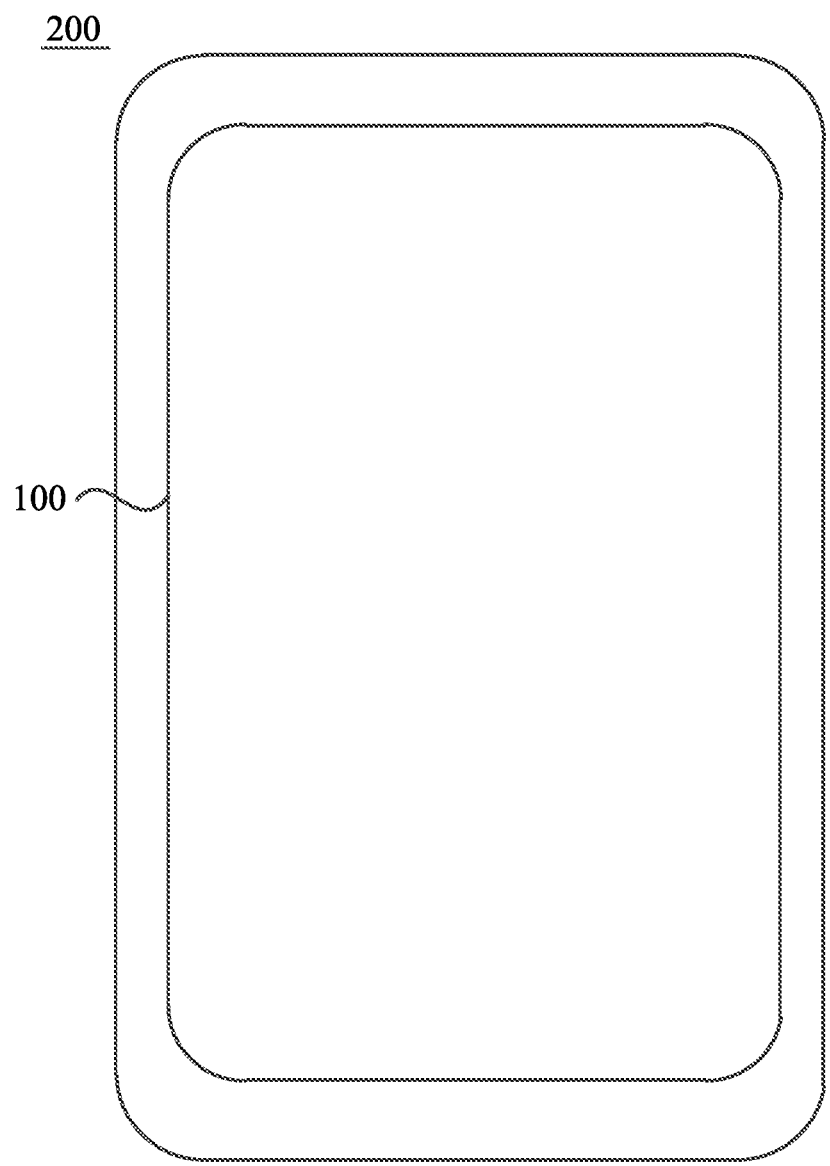
FIG. 26 is a structural view of a display device according to an embodiment of the present disclosure.

Exemplarily, FIG. 26 is a structural view of a display device according to an embodiment of the present disclosure. As shown in FIG. 26, the display device 200 provided by the embodiments of the present disclosure includes the display panel 100 provided by the embodiments of the present disclosure. The display device 200 may, exemplarily, be any electronic equipment with a display function such as a touch display screen, a cell phone, a tablet computer, a notebook computer or a television.

What is claimed is:

1. A manufacturing method of a display panel, comprising:
    providing a base substrate;
    forming a planarization layer on a side of the base substrate;
    forming a first film layer on a side of the planarization layer facing away from the base substrate;
    forming an anode via penetrating through the first film layer and the planarization layer;
    forming an anode layer on a side of the first film layer facing away from the base substrate;
    patterning the anode layer to form a first opening on the anode layer; and
    after patterning the anode layer, patterning the first film layer to form a second opening on the first film layer;
    wherein a material of the first film layer comprises a non-metallic material; the first opening penetrates through the anode layer, and the second opening at least partially penetrates through the first film layer; and an orthographic projection of the second opening on the base substrate at least partially overlaps an orthographic projection of the first opening on the base substrate.

2. The manufacturing method of a display panel according to claim 1, wherein the patterning the anode layer to form a first opening comprises:
    coating a photoresist layer on a side of the anode layer facing away from the base substrate;
    patterning the photoresist layer to form a photoresist pattern; and
    etching, by using the photoresist pattern as a mask plate, the anode layer to form the first opening on the anode layer.

3. The manufacturing method of a display panel according to claim 2, wherein the material of the first film layer is different from a material of the photoresist layer.

4. The manufacturing method of a display panel according to claim 3, wherein after patterning the anode layer, patterning the first film layer to form a second opening on the first film layer comprises:
etching, by using the photoresist pattern as a mask plate, the first film layer to form the second opening on the first film layer.

5. The manufacturing method of a display panel according to claim 3, further comprising:
removing the photoresist layer;
wherein after patterning the anode layer, patterning the first film layer to form a second opening on the first film layer comprises:
etching, by using the anode layer formed with the first opening as a mask plate, the first film layer to form the second opening.

6. The manufacturing method of a display panel according to claim 3, wherein the material of the first film layer comprises an organic material or an inorganic material.

7. The manufacturing method of a display panel according to claim 6, wherein the first film layer comprises the organic material, and a material of the planarization layer is the same as the material of the first film layer; and the planarization layer and the first film layer are formed by a same manufacturing process.

8. The manufacturing method of a display panel according to claim 6, wherein the first film layer comprises the organic material or the inorganic material; and
after patterning the anode layer, patterning the first film layer to form a second opening on the first film layer comprises:
after patterning the anode layer, dry etching the first film layer to form the second opening on the first film layer;
wherein a gas flow during a dry etching process is greater than a preset gas flow threshold.

9. The manufacturing method of a display panel according to claim 2, wherein a material of the first film layer is the same as a material of the photoresist layer; and
after patterning the anode layer, patterning the first film layer to form a second opening on the first film layer comprises:
simultaneously removing the photoresist layer and a part of the first film layer exposed by the first opening to form the second opening on the first film layer.

10. A display panel manufactured by the method according to claim 1, comprising:
the base substrate and the planarization layer, wherein the planarization layer is disposed on a side of the base substrate; and
the first film layer and the anode layer, wherein the first film layer is disposed on a side of the planarization layer facing away from the base substrate, and the anode layer is disposed on a side of the first film layer facing away from the base substrate; and the anode via is provided in the first film layer and the planarization layer, and the anode layer is filled in the anode via;
the anode layer is provided with the first opening, and the first opening penetrates through the anode layer; and the first film layer is provided with the second opening, and the second opening at least partially penetrates through the first film layer; and
the material of the first film layer is a non-metallic material; and an orthographic projection of the second opening on the base substrate at least partially overlaps the orthographic projection of the first opening on the base substrate.

11. The display panel according to claim 10, wherein a vertical projection of the second opening on the base substrate overlaps the vertical projection of the first opening on the base substrate.

12. The display panel according to claim 10, wherein the material of the first film layer comprises an organic material or an inorganic material.

13. The display panel according to claim 12, wherein the material of the first film layer comprises the inorganic material, and the second opening partially penetrates through the first film layer.

14. The display panel according to claim 12, wherein the material of the first film layer comprises the organic material, and the second opening penetrates through the first film layer.

15. The display panel according to claim 12, wherein the material of the first film layer comprises the organic material, and the material of the first film layer is the same as a material of the planarization layer.

16. The display panel according to claim 10, further comprising:
a driver circuit layer, disposed between the base substrate and the first film layer;
a light-emitting layer, disposed on a side of the anode layer facing away from the base substrate; and
a cathode layer, disposed on a side of the light-emitting layer facing away from the base substrate.

17. The display panel according to claim 16, further comprising a display region and a non-display region surrounding the display region;
wherein the driver circuit layer comprises a plurality of thin film transistors and a first power signal line; and
the anode layer comprises a connection electrode and a plurality of anodes, the plurality of anodes are disposed in the display region, the plurality of anodes are connected to the plurality of thin film transistors through vias, the connection electrode is at least partially disposed in the non-display region, the connection electrode is connected to the first power signal line through a via, and the connection electrode is connected to the cathode layer.

18. A display device, comprising the dispaly panel according to claim 10.

* * * * *